United States Patent
Ohara (10) Patent No.: US 10,559,643 B2
(45) Date of Patent: Feb. 11, 2020

(54) DISPLAY DEVICE INCLUDING A PREVENTING FILM FORMED IN THE TERMINAL REGION

(71) Applicant: Japan Display Inc., Minato-ku (JP)

(72) Inventor: Hiroki Ohara, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 272 days.

(21) Appl. No.: 15/352,947

(22) Filed: Nov. 16, 2016

(65) Prior Publication Data

US 2017/0250239 A1 Aug. 31, 2017

(30) Foreign Application Priority Data

Feb. 25, 2016 (JP) ................... 2016-034025

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01); *H01L 27/3262* (2013.01); *H01L 27/3265* (2013.01); *H01L 51/5203* (2013.01)

(58) Field of Classification Search
CPC ............. H01L 27/3276; H01L 27/3265; H01L 27/3248; H01L 27/3258; H01L 51/5253; H01L 2227/323; H01L 51/524; H01L 51/5246; H01L 27/3262
See application file for complete search history.

(56) References Cited

U.S. PATENT DOCUMENTS

| | | | | |
|---|---|---|---|---|
| 2013/0134401 A1* | 5/2013 | Murakami | .......... | H01L 51/5237 257/40 |
| 2014/0209914 A1* | 7/2014 | Nagasawa | ............. | H01L 27/124 257/72 |
| 2015/0144977 A1* | 5/2015 | Odaka | .................... | H01L 33/44 257/98 |
| 2015/0221683 A1* | 8/2015 | Odaka | ................. | H01L 27/1262 257/72 |
| 2017/0237032 A1* | 8/2017 | Koshihara | ........... | H01L 27/3218 257/88 |

FOREIGN PATENT DOCUMENTS

| | | | | |
|---|---|---|---|---|
| JP | 2009-205941 | | 9/2009 | |
| JP | 2017147046 A | * | 8/2017 | ......... H01L 27/3218 |

* cited by examiner

*Primary Examiner* — Mohsen Ahmadi
*Assistant Examiner* — Scott E Bauman
(74) *Attorney, Agent, or Firm* — Oblon, McClelland, Maier & Neustadt, L.L.P.

(57) ABSTRACT

A display device, including a display region formed of a plurality of pixels, and a terminal region formed on an outer side of the display region, includes a terminal wiring formed in the terminal region, a pixel wiring formed in each of the plurality of pixels, an insulating film, which is formed in the terminal region on an upper layer of the terminal wiring, and is formed in the display region on an upper layer of the pixel wiring, and a preventing film formed in the terminal region on an upper layer of the insulating film. The terminal wiring is exposed in an electrical connection region of the terminal region.

6 Claims, 6 Drawing Sheets

DISPLAY DEVICE INCLUDING A PREVENTING FILM FORMED IN THE TERMINAL REGION

CROSS-REFERENCE TO RELATED APPLICATION

The present application claims priority from the Japanese Application JP 2016-34025 filed on Feb. 25, 2016, the content of which is hereby incorporated by reference into this application.

BACKGROUND OF THE INVENTION

1. Field of the Invention

The present invention relates to a display device and a method of manufacturing a display device.

2. Description of the Related Art

In recent years, display devices such as liquid crystal display devices and organic electro-luminescent (EL) display devices using organic EL elements have been put into practical uses. In the organic EL display devices, the organic EL elements are deteriorated when being in contact with external water molecules, and hence the organic EL elements are generally covered with sealing films. The sealing film is formed on an entire array substrate in order to entirely cover the organic EL elements. As a result, there is required a terminal exposing step in which the sealing film on a terminal wiring is removed through etching after the array substrate and an opposing substrate are bonded to each other.

For example, in Japanese Patent Application Laid-open No. 2009-205941, the following method is described. After forming silicon nitride (SiN) as a sealing film so as to cover a display region and a terminal, the SiN is removed by etching through use of a reactive ion etching method, to thereby expose the terminal. Then, the terminal is connected to a display-driving IC.

SUMMARY OF THE INVENTION

As in Japanese Patent Application Laid-open No. 2009-205941, a terminal wiring is connected to a chip on glass (COG), a flexible printed circuit (FPC), or the like. Thus, when there are physical flaws or the like on a surface of the terminal wiring, there is a fear that a connection failure may occur between the terminal wiring and the COG or the like. Therefore, there may be considered covering the surface of the terminal wiring with a material having a high resistance to the flaws, after forming the terminal wiring and before connecting the terminal wiring to the COG or the like. In this case, when some films, which are used when pixels of the array substrate are formed, and a film for protecting the terminal are formed in the same step, an increase of a load in manufacturing steps can be suppressed.

However, the films used for forming the pixels are generally formed to be thinner than a sealing film arranged to prevent the pixels from being in contact with water molecules. As a result, there is a fear that, when the sealing film is removed (specifically, in the terminal exposing step), the film covering the terminal may also be removed due to an influence of a process, e.g., over-etching.

The present invention has been made in view of the above-mentioned problem, and has an object to provide an image display device including a film, which is formed with a high yield and prevents the flaws on the terminal, and a method of manufacturing the image display device while reducing the load in the manufacturing steps.

According to one aspect of the present invention, a display device, including a display region formed of a plurality of pixels, and a terminal region formed on an outer side of the display region, includes a terminal wiring formed in the terminal region, a pixel wiring formed in each of the plurality of pixels, an insulating film, which is formed in the terminal region on an upper layer of the terminal wiring, and is formed in the display region on an upper layer of the pixel wiring, and a preventing film formed in the terminal region on an upper layer of the insulating film. The terminal wiring is exposed in an electrical connection region of the terminal region.

In one embodiment of the present invention, the display device further includes, in each of the plurality of pixels, an anode electrode formed on an upper layer of the insulating film, the insulating film generating an electrostatic capacitance between the anode electrode and the pixel wiring.

In one embodiment of the present invention, the insulating film is formed of a material having a high etching selectivity ratio to the preventing film.

In one embodiment of the present invention, the insulating film is formed of silicon nitride.

In one embodiment of the present invention, the preventing film is formed of one of silicon oxide and aluminum oxide.

In one embodiment of the present invention, the display device, further includes a self-luminous element film formed in each of the plurality of pixels on an upper layer of the anode electrode, a cathode electrode, which is formed on an upper layer of the self-luminous element film, and is configured to be applied with a voltage between the anode electrode and the cathode electrode, to thereby cause the self-luminous element film to emit light, and a sealing film formed on an upper layer of the cathode electrode so as to cover the entire display region.

According to an another aspect of the present invention, there is provided a method of manufacturing a display device, including a display region formed of a plurality of pixels, and a terminal region formed on an outer side of the display region, includes the steps of forming a terminal wiring in the terminal region, forming a pixel wiring in each of the plurality of pixels, forming, in a region other than an electrical connection region of the terminal region, an insulating film on an upper layer of the pixel wiring, and a preventing film on an upper layer of the insulating film, forming a sealing film so as to cover an entire surface of the display region and the terminal region, and etching the sealing film formed in the terminal region, to thereby expose the terminal wiring in the electrical connection region. The sealing film is formed of a material having a high etching selectivity ratio to the preventing film.

In one embodiment of the present invention, the insulating film is formed of a material having a high etching selectivity ratio to the preventing film.

In one embodiment of the present invention, the preventing film is formed by performing a plasma treatment to the insulating film such that a surface of the insulating film is oxidized.

In one embodiment of the present invention, the step of the forming an insulating film and a preventing film includes the steps of forming the insulating film so as to cover the terminal region, etching the insulating film formed in the electrical connection region, to thereby expose the terminal wiring, and forming the preventing film in the region other than the electrical connection region on the upper layer of the insulating film.

In one embodiment of the present invention, the method of manufacturing a display device further includes the steps of forming an anode electrode in each of the plurality of pixels. In the forming an insulating film and a preventing film, the insulating film is formed so as to cover the terminal region, and is formed in the display region on the upper layer of the pixel wiring so as to generate an electrostatic capacitance between the pixel wiring and the anode electrode.

DETAILED DESCRIPTION OF THE INVENTION

Now, an embodiment of the present invention is described with reference to the attached drawings. For clearer illustration, some widths, thicknesses, shapes, and the like of respective portions are schematically illustrated in the drawings in comparison to actual dimensions. However, the widths, the thicknesses, the shapes, and the like are merely an example, and do not limit understanding of the present invention. Further, like elements as those described relating to the drawings already referred to are denoted by like reference symbols herein and in each of the drawings, and detailed description thereof is sometimes omitted as appropriate.

Figure 1:
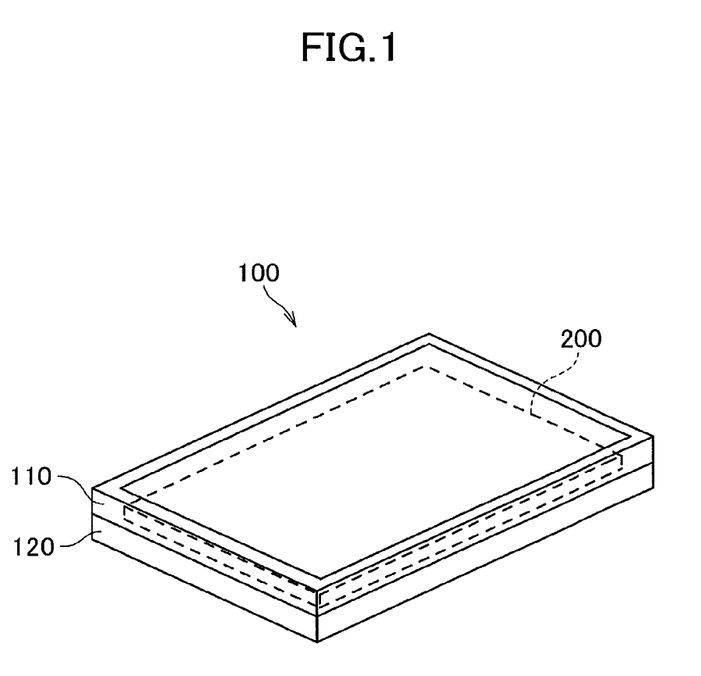
FIG. 1 is a view for schematically illustrating a display device according to an embodiment of the present invention.

FIG. 1 is a view for schematically illustrating a display device 100 according to an embodiment of the present invention. As illustrated in FIG. 1, the display device 100 includes an organic EL panel 200 fixed and sandwiched between an upper frame 110 and a lower frame 120.

Figure 2:
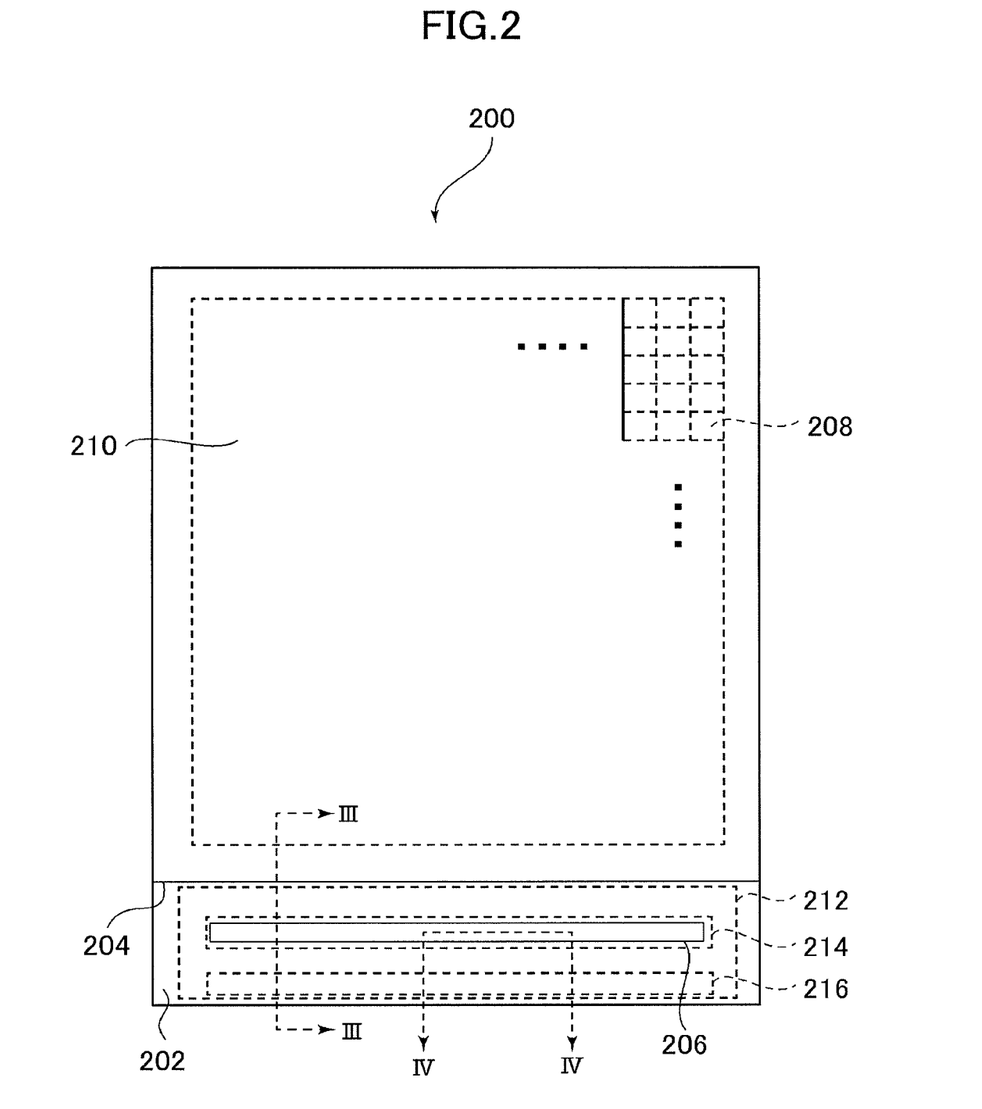
FIG. 2 is a view for illustrating a configuration of an organic EL panel as viewed from a display side thereof.

FIG. 2 is a view for schematically illustrating a configuration of the organic EL panel 200 of FIG. 1. As illustrated in FIG. 2, the organic EL panel 200 includes an array substrate 202, an opposing substrate 204, and a driving integrated circuit (IC) 206. Further, the organic EL panel 200 includes a display region 210 formed of a plurality of pixels 208, and a terminal region 212 arranged on an outer side of the display region 210. The terminal region 212 is a region where there are arranged wirings and terminals for supplying signals and the like from outside of the organic EL panel 200 to the pixels 208 formed on the display region 210. Further, the terminal region 212 includes an electrical connection region in which a terminal wiring 308 (see the arrow and dashed lines in FIG. 3) is exposed. The electrical connection region includes a driving IC connection region 214 to be electrically connected to the driving IC 206, and an FPC connection region 216 to be electrically connected to an FPC (not shown). A preventing film 322, a sealing film 324, and the like to be described below are arranged on the array substrate 202. Further, the array substrate 202 is bonded to the opposing substrate 204 by a filler 332 and a sealing material 334.

The driving IC 206 is configured to apply a potential, which is for causing a current to flow between a source and a drain, to scanning signal lines of pixel transistors that are arranged so as to correspond to a plurality of subpixels forming one pixel 208, and is configured to cause a current corresponding to a grayscale value of the pixel 208 to flow through data signal lines of each of the pixel transistors, for example. The organic EL panel 200 is configured to display a color image, which is formed by the plurality of subpixels that include a plurality of colors, on the display region 210 through use of the driving IC 206.

Figure 3:
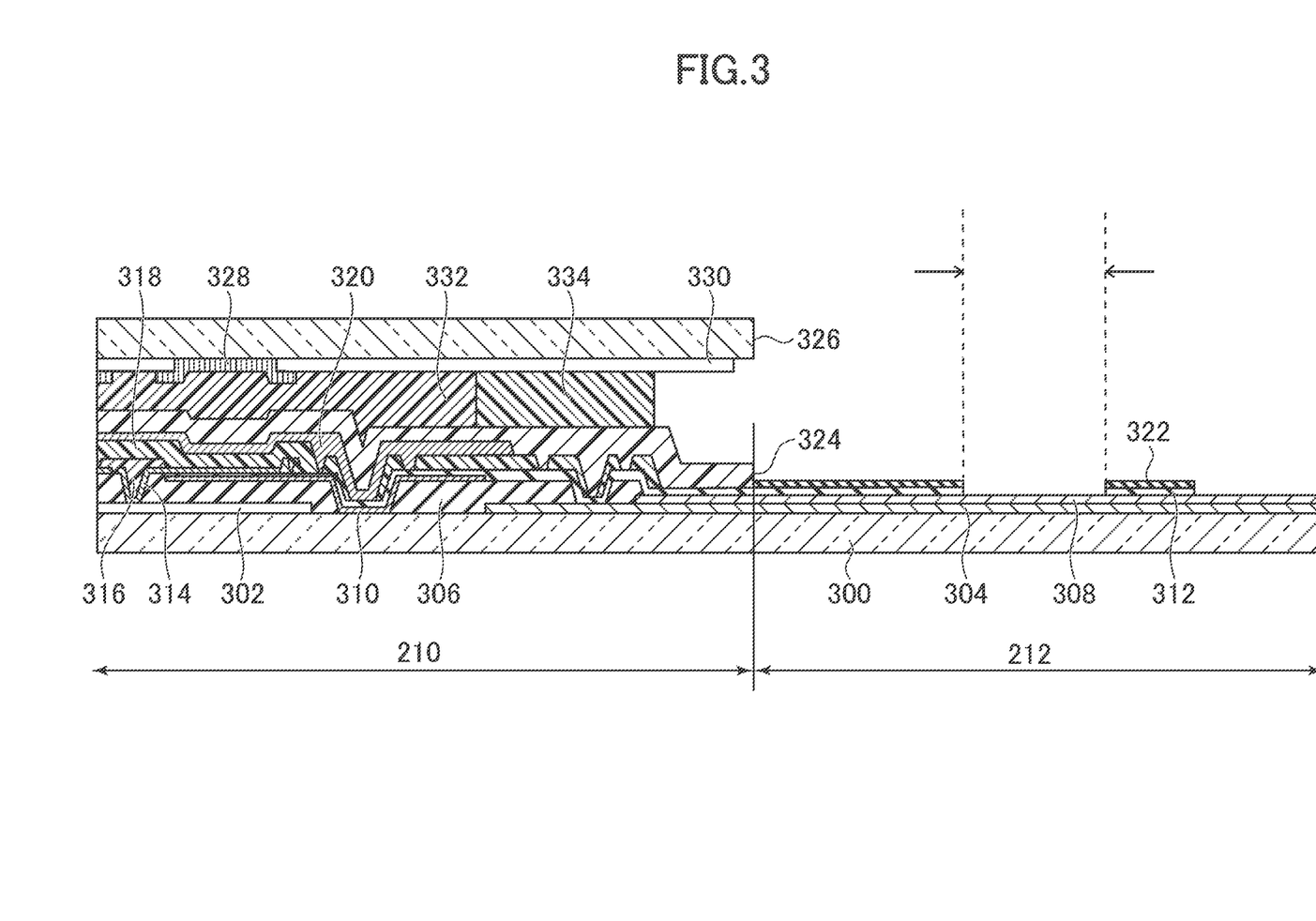
FIG. 3 is a view for illustrating a cross section of the organic EL panel from a display region to a terminal region.

FIG. 3 is an example of a view for schematically illustrating a cross section of the organic EL panel 200 from the display region 210 to the terminal region 212, and is a sectional view taken along the line of FIG. 2. As illustrated in FIG. 3, the array substrate 202 includes a lower glass substrate 300, a thin film transistor (TFT) circuit layer 302 formed on the lower glass substrate 300, a gate wiring 304, an interlayer insulating film 306, the terminal wiring 308, a pixel wiring 310, an insulating film 312, an anode electrode 314, a rib 316, a self-luminous element film 318, a cathode electrode 320, the preventing film 322, and the sealing film 324. The opposing substrate 204 includes an upper glass substrate 326, the color filter 328, and a light shielding film 330. Further, the array substrate 202 and the opposing substrate 204 are bonded together by the filler 332 and the sealing material 334 that are arranged between the two substrates.

The TFT circuit layer 302 includes the pixel transistor having a source electrode, a drain electrode, a gate electrode, a semiconductor layer, and the like. One of the source electrode and the drain electrode is electrically connected to the anode electrode 314.

In the terminal region 212, the gate wiring 304 is formed of a material such as Al, on the lower glass substrate 300. The gate wiring 304 is configured to transmit a signal input from the COG or the FPC, which is connected to the array substrate 202, to the display region 210. The gate wiring 304 is illustrated in the cross section of FIG. 3, but in a case of a cross section that is taken along a different line, other wirings such as a power source wiring may be formed on the place where the gate wiring 304 is illustrated in FIG. 3.

The interlayer insulating film 306 is formed in the display region 210 so as to cover the TFT circuit layer 302. The interlayer insulating film 306 is configured to prevent a short circuit between the anode electrode 314 and the electrode included in the TFT circuit layer 302, and to flatten level differences due to the pixel transistor and the wirings arranged on a lower layer side. Specifically, the interlayer insulating film 306 is formed by laminating silicon nitride and silicon oxide.

The terminal wiring 308 is formed in the terminal region 212. Specifically, in the terminal region 212, the terminal wiring 308 is formed on an upper layer of the gate wiring 304, and is formed to be exposed in the electrical connection region of the terminal region 212, for example. The COG or the FPC connected to the array substrate 202 is electrically connected to the gate wiring 304 via the terminal wiring 308. The terminal wiring 308 is formed by laminating Ti, Al, Ti, and ITO, for example.

The pixel wiring 310 is formed in the pixel 208. Specifically, in the pixel 208, the pixel wiring 310 is formed on an upper layer of the interlayer insulating film 306, and is formed as a part of electrodes for generating an electrostatic capacitance for maintaining a potential of the anode electrode 314, for example.

In the terminal region 212, the insulating film 312 is formed on an upper layer of the terminal wiring 308. In the display region 210, the insulating film 312 is formed on an upper layer of the pixel wiring 310. Specifically, in the terminal region 212, the insulating film 312 is formed on the upper layer of the terminal wiring 308 so as to protect the terminal wiring 308. In the display region 210, the insulating film 312 is arranged between the pixel wiring 310 and the anode electrode 314 so as to generate the electrostatic capacitance.

In this case, it is desirable that a material having a high Young's modulus be used for the insulating film 312 to protect the terminal wiring 308 from physical flaws such as scratches. Further, in FIG. 3, there is illustrated a configuration in which the insulating film 312 protects the terminal wiring 308. However, in terms of reducing the load in manufacturing steps, a configuration in which other layers laminated in the display region protect the terminal wiring 308 is also possible. Further, as described in detail below, it is desirable that the insulating film 312 be formed of a material having a high etching selectivity ratio to the preventing film 322. Specifically, it is desirable that the insulating film 312 be formed of silicon nitride, for example.

The anode electrode 314 is formed on an upper layer of the insulating film 312. The anode electrode 314 is formed in the display region 210 so as to be electrically connected to the source electrode or the drain electrode of the pixel transistor via a contact hole of the interlayer insulating film 306. Specifically, the anode electrode 314 is formed by laminating indium tin oxide (ITO), Ag, and ITO, for example.

The rib 316 is formed in the display region 210 so as to cover each peripheral edge of the anode electrode 314. Specifically, as illustrated in FIG. 3, in the display region 210, the rib 316 is formed above the anode electrode 314 with a resin material. The anode electrode 314 is formed in a through hole formed in the interlayer insulating film 306. The short circuit between the anode electrode 314 and the cathode electrode 320 can be prevented by the rib 316.

The self-luminous element film 318 is formed on an upper layer of the anode electrode 314. Specifically, in the display region 210, the self-luminous element film 318 is formed above an upper layer side of the anode electrode 314 and the rib 316. Further, the self-luminous element film 318 is formed by laminating a hole injection layer, a hole transport layer, a light emitting layer, an electron injection layer, and an electron transport layer. The light emitting layer is configured to emit light by recombining holes injected from the anode electrode 314 with electrons injected from the cathode electrode 320. The hole injection layer, the hole transport layer, the electron injection layer, and the electron transport layer are similar to those in the related art, and hence description thereof is omitted. In this embodiment, the light emitting layer is formed through use of a material for emitting white light, but the light emitting layer may also be formed through use of materials for emitting red light, green light, and blue light.

The cathode electrode 320 is formed on an upper layer of the self-luminous element film 318, and a voltage is applied between the anode electrode 314 and the cathode electrode 320, to thereby cause the self-luminous element film 318 to emit light. Specifically, the cathode electrode 320 is formed of a light-transmissive metal thin film. The cathode electrode 320 is formed of, for example, ITO or IZO, or the like.

In the terminal region 212, the preventing film 322 is formed on the upper layer of the insulating film 312. Specifically, in a region other than the electrical connection region of the terminal region 212, the preventing film 322 is formed on the upper layer of the insulating film 312. When an etching selectivity ratio of a material used for the sealing film 324 and the insulating film 312 is not high, there is a fear that, in a step of exposing the terminal wiring 308, the insulating film 312 may be removed together with the sealing film 324 due to over-etching. However, by forming the preventing film 322, the insulating film 312 can be prevented from being removed. Therefore, it is desirable that the preventing film 322 be formed of a material having a low etching selectivity ratio to the insulating film 312. Specifically, it is desirable that the preventing film 322 be formed of, for example, SiOx (silicon oxide), SiOxNy (silicon oxynitride), AlxOy (aluminum oxide), and AlxOyNz (aluminum oxynitride).

The sealing film 324 is formed on an upper layer of the cathode electrode 320 so as to cover the entire display region 210. Specifically, as illustrated in FIG. 3, the sealing film 324 is formed in the display region 210 so as to cover the cathode electrode 320, the rib 316, and the insulating film 312. By covering the cathode electrode 320 with the sealing film 324, a chemical reaction between the water molecules and the self-luminous element film 318 formed on the lower layer of the cathode electrode 320 can be prevented. The sealing film 324 is formed with use of SiN, for example.

The color filter 328 is formed of a material for transmitting only colors with particular wavelengths. For example, the color filter is formed of a red color filter for selectively transmitting red light, a green color filter for selectively transmitting green light, and a blue color filter for selectively transmitting blue light. A configuration without the color filter 328 is also possible when the light emitting layer is formed of materials for emitting red light, green light, and blue light.

The light shielding film 330 is formed of a material for blocking light. Specifically, for example, as illustrated in FIG. 3, the light shielding film is formed between the color filters 328 and around a frame of the upper glass substrate 326 in the display region 210. By the light shielding film, there can be prevented a situation in which light beams emitted from adjacent subpixels mix together to generate a mixed color.

The filler 332 is arranged between the array substrate 202 and the opposing substrate 204. Specifically, the filler 332 includes organic materials, and is arranged so as to fill a space between the array substrate 202 and the opposing substrate 204, to thereby bond the array substrate 202 and the opposing substrate 204 to each other. The sealing material 334 is arranged around the filler 332, to bond the array substrate 202 and the opposing substrate 204 to each other.

Figure 4:
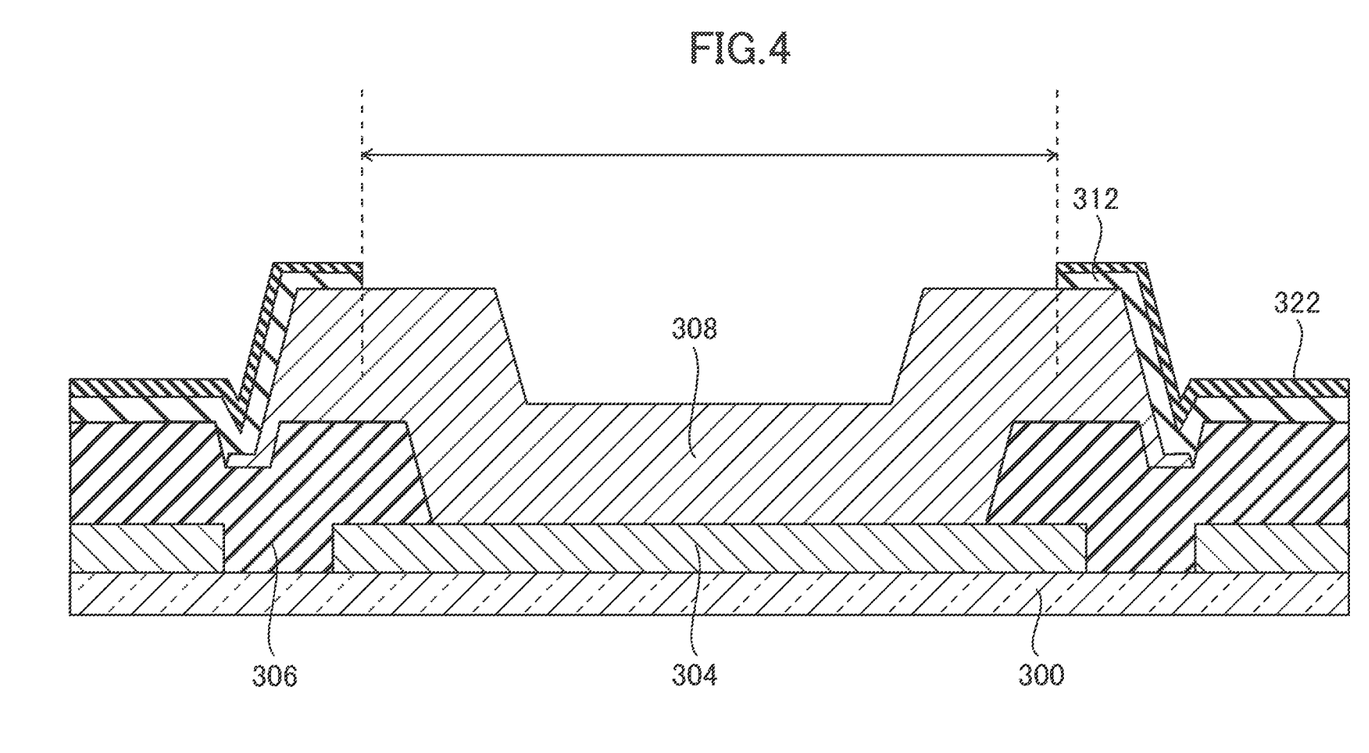
FIG. 4 is a view for illustrating a cross section of the organic EL panel at the terminal region.

Next, a cross section of the electrical connection region of the organic EL panel 200 is described. FIG. 4 is a sectional view taken along the line IV-IV of FIG. 2. As illustrated in FIG. 4, in the cross section IV-IV, the organic EL panel 200 includes the lower glass substrate 300, the gate wiring 304, the interlayer insulating film 306, the terminal wiring 308, the insulating film 312, and the preventing film 322.

The gate wiring 304 is formed on the lower glass substrate 300, as in the cross section Three gate wirings 304 are illustrated in FIG. 4. The interlayer insulating film 306 is formed so as to cover end portions of each gate wiring 304. The terminal wiring 308 is formed on the gate wiring 304 in a region where the interlayer insulating film 306 is not formed and on an upper layer of end portions of the interlayer insulating film 306. The insulating film 312 and the preventing film 322 are formed above the upper layer of the interlayer insulating film 306 and the end portions of the terminal wiring 308. As described above, in the cross section IV-IV of the electrical connection region, the terminal wiring 308 is exposed from the insulating film 312 and the preventing film 322, and is electrically connected to the COG and the FPC. The interlayer insulating film 306 is formed by laminating SiN and SiO, for example, and the terminal wiring 308 is formed by laminating Ti, Al, Ti, and ITO, for example, but illustration thereof is omitted in FIG. 4.

As described above, according to the configuration of the present invention, by forming the preventing film 322, the insulating film 312 can be prevented from being removed together with the sealing film 324 due to over-etching in a terminal exposing step.

Figure 5A:
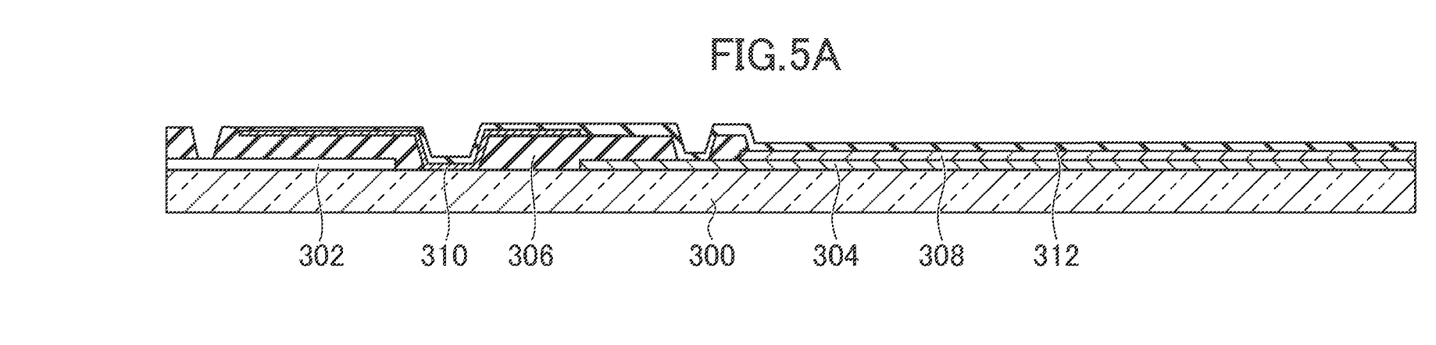
FIG. 5A, FIG. 5B, and FIG. 5C are views for illustrating a method of manufacturing the organic EL panel.

Next, steps for manufacturing the display device 100 according to the present invention are described. FIG. 5A to FIG. 5C and FIG. 6A to FIG. 6C are views for illustrating the manufacturing steps according to the embodiment of the present invention. First, as illustrated in FIG. 5A, on the lower glass substrate 300, the TFT circuit layer 302 is formed in the display region 210 and the gate wiring 304 is formed in the terminal region 212. Then, the terminal wiring 308 is formed on the upper layer of the gate wiring 304 from the terminal region 212 to an end portion of the display region 210. Further, the interlayer insulating film 306 is formed in the display region 210 so as to cover the TFT circuit layer 302. Then, the through hole, which is for connecting the source electrode or the drain electrode included in the pixel transistor to the anode electrode 314, is formed in the interlayer insulating film 306.

Further, the pixel wiring 310 is formed on the upper layer of the interlayer insulating film 306. Then, the insulating film is formed from the upper layer of the interlayer insulating film 306 and the pixel wiring 310 in the display region 210 to the upper layer of the terminal wiring 308 in the terminal region 212. Specifically, the insulating film 312 is formed with use of SiN to a thickness of 200 nm, for example.

Now, by covering the terminal wiring 308 with the insulating film 312, the terminal wiring 308 is protected by the insulating film 312 until the step of exposing the terminal wiring 308. In the step of forming the insulating film 312, the insulating film 312 is formed so as to cover the terminal region 212 in order to protect the terminal wiring 308, and is formed in the display region 210 on the upper layer of the pixel wiring 310 in order to generate the electrostatic capacitance. The layer for generating the electrostatic capacitance between the pixel wiring 310 and the anode electrode 314, and the layer for protecting the terminal wiring 308 are formed in the same step, and hence the load in the manufacturing steps is reduced.

Figure 5B:
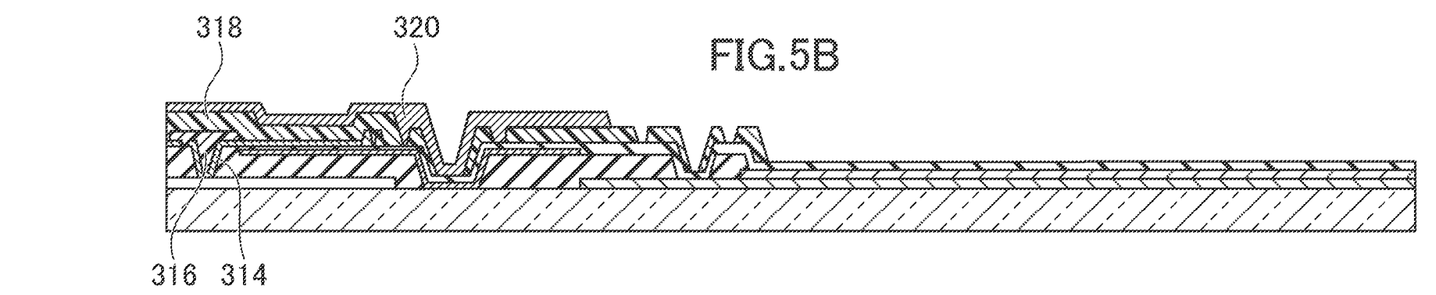

Next, as illustrated in FIG. 5B, the anode electrode 314, the rib 316, the self-luminous element film 318, and the cathode electrode 320 are sequentially formed in the display region 210. This step is similar to that in the related art, and hence detailed description thereof is omitted.

Figure 5C:
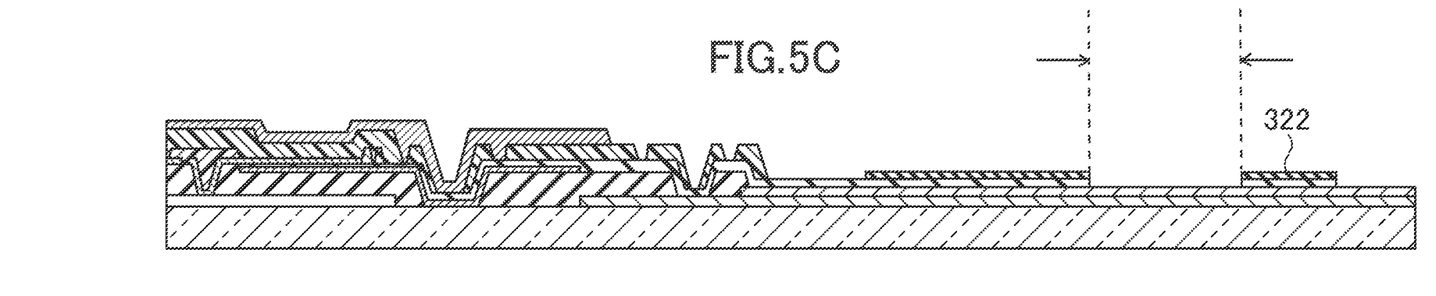

Then, as illustrated in FIG. 5C, the insulating film 312 formed in the electrical connection region is etched, to thereby expose the terminal wiring 308. Subsequently, in a region other than the electrical connection region described above, the preventing film 322 is formed on the upper layer of the insulating film 312. Specifically, through methods such as sputtering and CVD, the preventing film 322 is formed with use of SiO to a thickness of from 5 nm to 50 nm, preferably from 5 nm to 10 nm, for example.

In this case, the preventing film 322 may be formed by laminating the preventing film 322 so as to cover the terminal region 212, and then removing, through photolithography, the preventing film 322 laminated in the region other than the electrical connection region. Alternatively, the preventing film 322 may be formed by laminating the preventing film 322 only in the region other than the electrical connection region through use of a hard mask.

The step of removing the insulating film 312 formed in the electrical connection region, and the step of forming the preventing film 322 in the region other than the electrical connection region may be performed in the middle of or before the step of sequentially forming the anode electrode 314, the rib 316, the self-luminous element film 318, and the cathode electrode 320. After the step of exposing the terminal wiring 308 and before the step of forming the sealing film 324, the terminal wiring 308 in the electrical connection region is exposed, and hence there is a fear that scratches and the like are made. Therefore, it is desirable to remove the insulating film 312 right before the step of forming the sealing film 324.

Further, the preventing film 322 may be formed by performing a plasma treatment to the insulating film 312 such that a surface of the insulating film 312 is oxidized. Specifically, the preventing film 322 may be formed by performing the plasma treatment, with use of oxygen gas or dinitrogen oxide gas, to the insulating film 312 formed of SiN, such that a part of the insulating film is oxidized into SiO, for example. When the preventing film 322 is formed using the plasma treatment, in order to prevent the terminal wiring 308 from being oxidized, it is desirable that the plasma treatment be performed before removing the insulating film 312 formed in the electrical connection region. In this case, the preventing film 322 and the insulating film 312 that are formed in the electrical connection region are removed together after the plasma treatment.

Figure 6A:
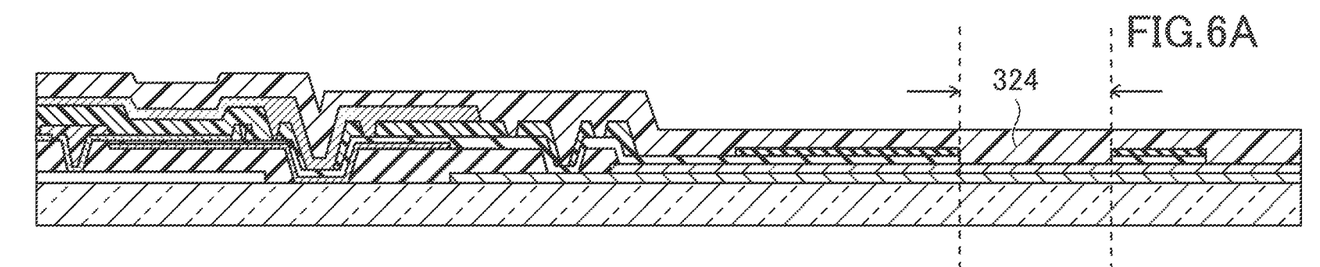
FIG. 6A, FIG. 6B, and FIG. 6C are views for illustrating the method of manufacturing the organic EL panel.

Next, as illustrated in FIG. 6A, the sealing film 324 is formed so as to cover the entire surface of the display region 210 and the terminal region 212 of the array substrate 202. The self-luminous element film 318 formed in the display region 210, and the terminal wiring 308 exposed in the electrical connection region are protected by the sealing film 324.

Figure 6B:
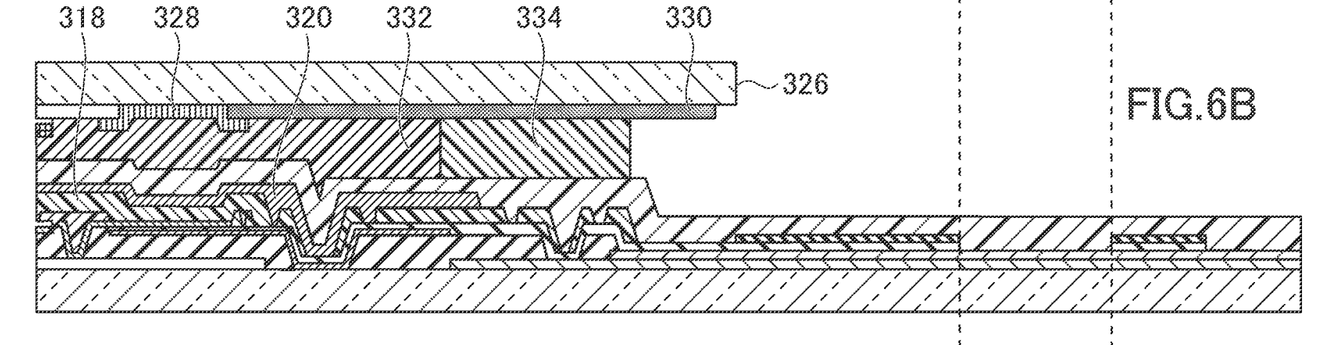

Subsequently, as illustrated in FIG. 6B, the sealing material 334 and the filler 332 are dropped onto the array substrate 202. Specifically, for example, through use of a dispenser, the sealing material 334 is dropped so as to surround the display region 210, and the filler 332 is dropped onto the display region at a certain interval. Then, the array substrate 202 having the sealing material 334 and the filler 332 dropped thereon, and the opposing substrate 204 having the color filter 328 and the light shielding film 330 formed thereon are bonded together. Here, the method of manufacturing the opposing substrate 204 is similar to that in the related art, and hence description thereof is omitted.

Figure 6C:
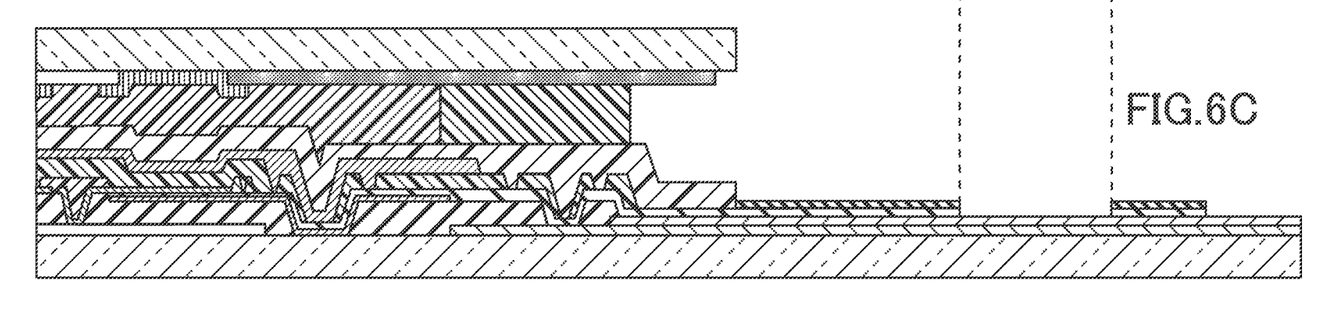

Then, as illustrated in FIG. 6C, there is performed the terminal exposing step in which the sealing film 324 formed in the terminal region 212 is etched, to thereby expose the terminal wiring 308 in the electrical connection region. Specifically, dry-etching is performed with use of mixed gas of fluorine-containing gas (such as SF6, NF3, and CF4) and oxygen gas, to thereby remove the sealing film 324 formed in the terminal region 212, for example. Here, by performing dry-etching by using the opposing substrate 204 as the hard mask, a step of forming patterns, e.g., photolithography may be omitted.

Further, by the preventing film 322 formed in the region other than the electrical connection region in the terminal region 212, the insulating film 312 formed in the region other than the electrical connection region is prevented from being removed together with the sealing film 324 in the terminal exposing step. Therefore, it is desirable that the sealing film 324 be formed of a material having a high etching selectivity ratio to the preventing film 322, and that the insulating film 312 be formed of a material having a high etching selectivity ratio to the preventing film 322, such that the preventing film 322 is not removed in the terminal exposing step.

According to the steps described above, there is achieved the organic EL panel 200 in which, because of the preventing film 322 serving as an etching stopper, the insulating film 312 can be prevented from being removed together with the sealing film 324 in the terminal exposing step.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, including a display region formed of a plurality of pixels, and a terminal region formed on an outer side of the display region, comprising:
   a sealing film covering the plurality of pixels;
   a terminal wiring formed in the terminal region;
   an insulating film which is formed in the terminal region on the terminal wiring; and
   a preventing film formed on an entirety of the insulating film in the terminal region, wherein
   the insulating film and the preventing film expose the terminal wiring in the terminal region, and
   the preventing film directly contacts the sealing film without overlapping the sealing film.

2. The display device according to claim 1, further comprising, in each of the plurality of pixels, an anode electrode formed on the insulating film and a pixel wiring, wherein
   the insulating film is between the anode electrode and the pixel wiring.

3. The display device according to claim 1, wherein the insulating film is formed of silicon nitride.

4. The display device according to claim 1, wherein the preventing film is formed of one of silicon oxide and aluminum oxide.

5. The display device according to claim 1, further comprising:
   a self-luminous element film formed in each of the plurality of pixels on an upper layer of an anode electrode; and
   a cathode electrode which is formed on an upper layer of the self-luminous element film, and is configured to be applied with a voltage between the anode electrode and the cathode electrode, to thereby cause the self-luminous element film to emit light;
   wherein the sealing film is formed on an upper layer of the cathode electrode, and located in an entirety of the display region.

6. The display device according to claim 1, wherein the preventing film is formed in the terminal region without overlapping the display region.

* * * * *